United States Patent [19]

Fusselman et al.

[11] Patent Number: 4,735,582
[45] Date of Patent: Apr. 5, 1988

[54] SOLDERED CABLE TRANSITION CONNECTOR

[75] Inventors: David F. Fusselman, Middletown; Timothy A. Lemke, Carlisle, both of Pa.

[73] Assignee: E. I. Du Pont de Nemours and Company, Wilmington, Del.

[21] Appl. No.: 935,386

[22] Filed: Nov. 26, 1986

[51] Int. Cl.⁴ .............................................. H01R 9/09
[52] U.S. Cl. ..................................... 439/329; 439/67; 439/98
[58] Field of Search ................. 339/17 F, 17 C, 14 R, 339/176 MF, 75 M, 75 MP, 107; 439/55, 67, 77, 329, 492, 493, 98

[56] References Cited

U.S. PATENT DOCUMENTS 4,252,392 2/1981 Whiteman, Jr. ............. 339/176 MF

Primary Examiner—Neil Abrams

[57] ABSTRACT

A positioning apparatus for locating conductor wires of a cable over mounting pads on a substrate is characterized by a base having a recess into which the conductors are introduced. The base has grooves which support the conductor wires in parallel. A portion of the conductor wires extend cantilever fashion past the forward edge thereof. A cover has an array of resilient fingers which impart a biasing force to extending wires of a multiconductor cable to urge these wires into contact with conductive mounting pads provided on a substrate as the base and cover are drawn together.

11 Claims, 2 Drawing Sheets

SOLDERED CABLE TRANSITION CONNECTOR

FIELD OF THE INVENTION

The present invention relates to a connector arranged to assist in forming a solder connection between individual wires of a multiconductor cable and corresponding mounting pads on a planar circuit board.

DESCRIPTION OF THE PRIOR ART

One of the major problems involved in the attachment of a cable to a circuit board, or, more precisely, the attachment of individual wires of a multiconductor cable to respective mounting pads provided along the edge of a planar substrate by soldering or other thermal fusion methods is the proper positioning of the individual wires with respect to the pads. The individual wire must be precisely located on the appropriate conductive pad and should, in the preferred case, be biased by some biasing force against the pads during the fusion operation. This is particularly true in soldering operations where the individual wire, if not properly biased against the pads, can "float" while the solder is molten. Floating of the wire can lead to misregistration between the wire and the pad and can result in a poor or imperfectly formed solder connection between the wire and the pad. This event is considered to be disadvantageous.

In addition, each wire of a multiconductor cable that is directly soldered to the edge of a substrate should be provided with some strain relief mechanism to protect against inadvertent displacement of the wire from its respective pad. Further, in some instances where shielded cables are used, an effective connection to the ground circuitry on the board must also be made.

Conventionally the wire attachment is made by means of a reusable metal fixture which positions the individual conductor relative to the substrate. Such a fixture is unwieldy, must be circulated through the assembly line and must be carefully maintained. The strain relief mechanism when the cable is directly attached to the substrate is usually comprised of metal strips or cable ties which are not believed to be particularly effective. The mounting of the shield is dependent upon skilled labor for a quality joint and if the connection between the cable shield and the substrate is too long the shielding effect on the cable is diminished.

In view of the foregoing it is believed advantageous to provide a connector assembly which appropriately positions the individual wires of a multiconductor cable with respect to their respective contact pads, and simultaneously provides a mechanism for imparting a biasing force on the wires to urge them into contact with a molten solder pool on the pads. Further, it would be advantageous to provide a connector which provides strain relief protection for the individual wires as well as an effective and secure shield termination in the event a shielded cable is being acted upon.

SUMMARY OF THE INVENTION

In accordance with the present invention a multiconductor cable connector comprises a base and a corresponding complimentary cover. The base has a recess terminating in a forward edge. The recess is sized to receive a fanned array of conductors from the multiconductor cable, with each conductor extending in cantilever fashion past the forward edge of the base. An array of positioning grooves is formed in the base. Each groove is adapted to receive an individual one of the wires of the multiconductor cable. The complementary cover is sized for receipt on the base. The cover has an array of resilient fingers that extend a predetermined distance past the forward edge of the base when the cover is received thereon. The fingers have corresponding grooves which register with the grooves in the base. The grooves in the cover and the base cooperate to define channels which position in parallel relationship the individual wires received therein. The cover further includes a partition spaced rearwardly of the fingers. The partition has grooves formed along the lower edge thereof. The grooves in the partition axially register with the grooves in the fingers and serve to support the conductors within the recess.

Means are provided for drawing the substrate, base and cover together. This action flexes the forwardly projecting resilient fingers to impart a biasing force to the individual conductors which urges them into contact with the solder pads provided on a planar substrate. Thus, when the cover is secured to the base the wires of the conductors are biased against the surface of the substrate to prevent them from floating with respect to the solder pads, thus insuring that the wire of the conductor is securely bonded directly to the pad.

The connector also includes a ground contact element, typically of the insulation displacement type, which is engageable by the drawing means and responsive thereto to interconnect with a ground shield in the cable.

BRIEF DESCRIPTION OF THE DRAWINGS

The invention will be more fully understood from the following detailed description thereof taken in connection with the accompanying drawings which form a part of this application and in which.

DETAILED DESCRIPTION OF THE INVENTION

Figure 1:
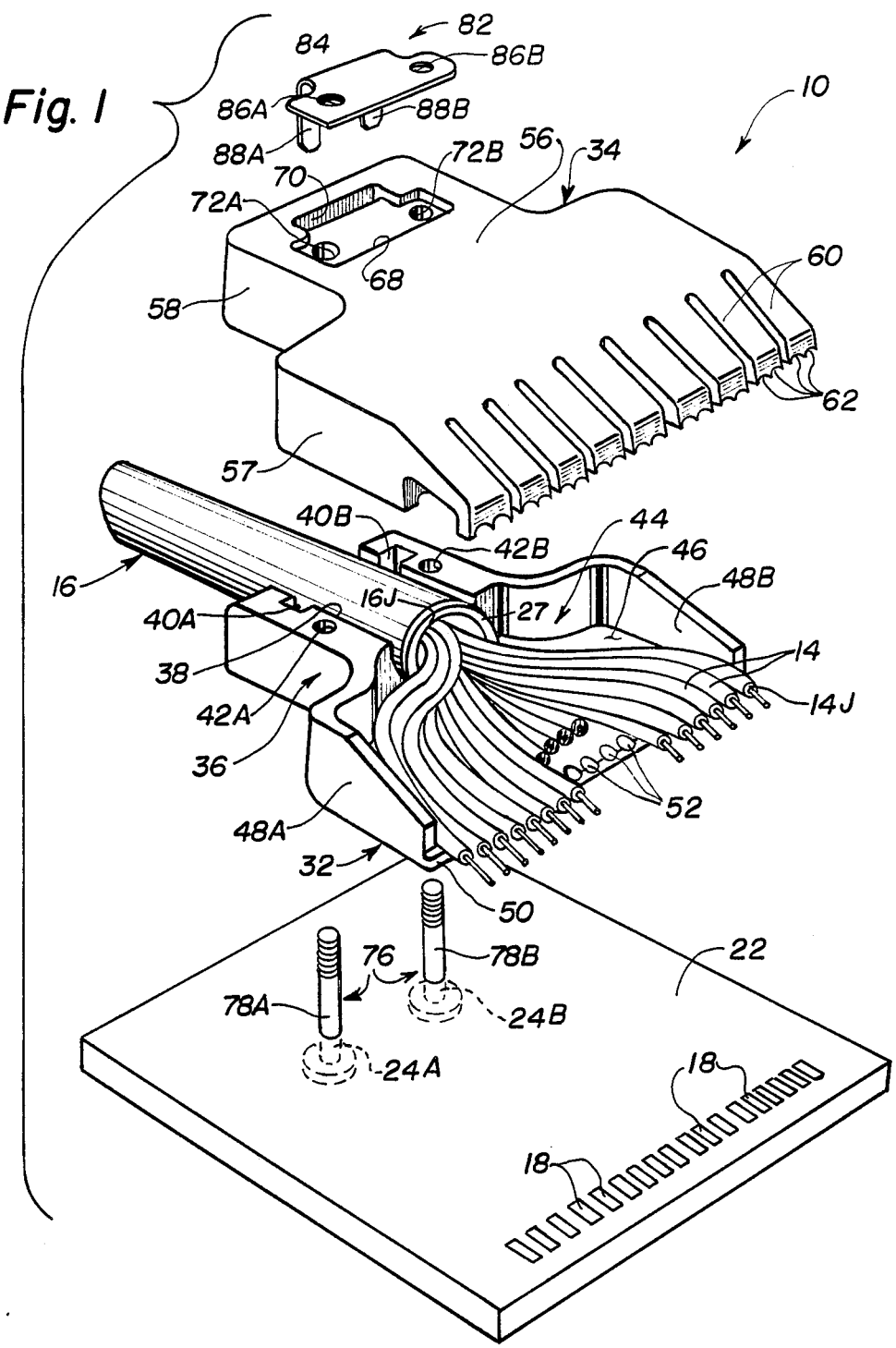
FIG. 1 is an exploded perspective view of a connector in accordance with the present invention.
Figure 2:
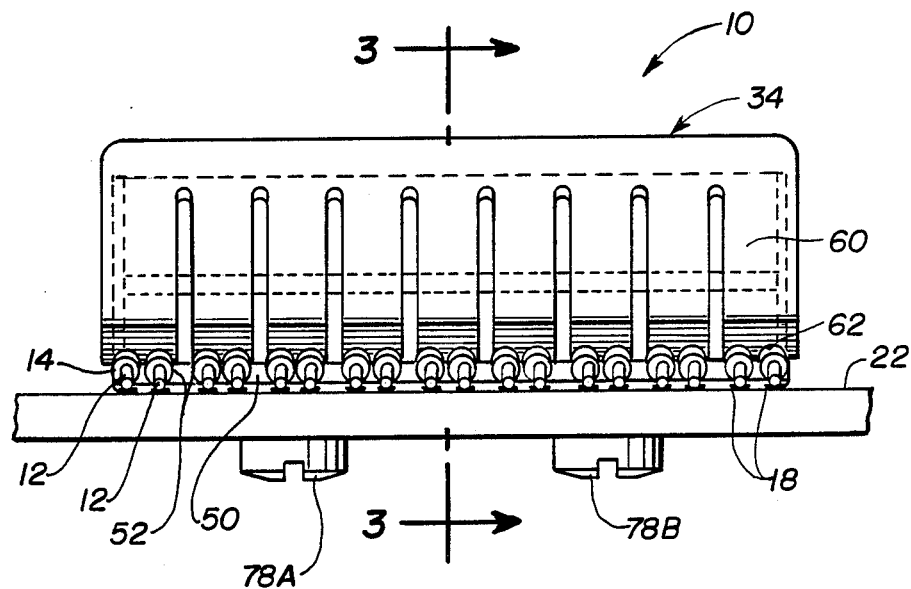
FIG. 2 is a front elevational view of the connector in accordance with the present invention in its assembled condition.

Throughout the following detailed description similar reference numerals refer to similar elements in all figures of the drawings.

Referring to the Figures a connector generally indicated by reference character 10 is provided whereby the individual wires 12 of the individual jacketed conductors 14 of a multiconductor cable 16 may be effectively and securely fixed to the conductor pads 18 conveniently located on a planar substrate 22, as, for example, along the edge thereof. The substrate 22 has openings 24A and 24B provided therein for a purpose to be discussed. The cable 16 may be any suitable helically or spirally wound cable having a conductive shield 26 (FIG. 3) surrounded by an outer insulating jacket 16J. The jacket 16J is removed a predetermined distance from the end of the cable 16 such that the individual conductors 14 therein may be fanned into a substantially planar orientation, as shown in the Figures. A conductive ferrule 27 is located between the conductors 14 and the shield 26 to rigidize the cable 16 in this region. The jackets 14J of the individual conductors 14 are removed a predetermined distance from the ends of the individual conductors 14 thereby exposing some predetermined length of wire 12 disposed therein.

The connector 10 includes a base 32 and a complementary cover 34. Both the base 32 and the cover 34 are fabricated, preferably by molding, from a suitable insulating material, such as plastic. The base 32 includes a boss portion 36 having an access passage 38 extending therethrough. Slots 40A, 40B and bores 42A, 42B, are provided on each side of the passage 38, respectively, for a purpose to be described. The passage 38 communicates with an open recess 44 defined by a bottom 46 and two upstanding sidewalls 48A, 48B integrally formed with the boss portion 36. The forward edge 50 of the bottom 46 of the base 32 is provided with grooves 52 that extend a predetermined distance rearwardly from the forward edge 50. In FIG. 1, some of the conductors 14 are removed to illustrate the grooves 52. Standoffs 54 (FIG. 3) support the base 32 above the substrate 22.

As seen in the Figures the recess 44 is sized to receive the fanned array of conductors 14. The jacketed portions of the conductors 14 are received in the individual grooves 52 so that the conductors 14 are maintained in substantially parallel relationship with each other. The conductors 14 extend, cantilever fashion, past the forward edge 50 of the base 32.

The cover 34 is configured for overlapping receipt on the base. The cover 34 includes a main portion 56 having downwardly turned skirts 57, 58 which, when assembled, closely contact the exterior of the sidewalls 48A, 48B and the sides and rear of the boss 36, respectively. The rear portion of the skirt 58 overlies the cable 16 as the same enters the connector 10. The passage 38 in the base 32 is configured to conform to the exterior shape of the cable 16. Thus, for a round cable, the passage 38 is substantially circular. If the cable is planar (flat), the passage 38 is correspondingly shaped. The rear portion of the skirt 58 may also be contoured, as at 59 (FIG. 3) to match the exterior of the cable. Together, the contoured openings 38, 59 in the base 32 and the cover 34 respectively cooperate to define an access aperture whereby the cable 16 (of whatever shape) may enter into the connector 10.

Figure 3:
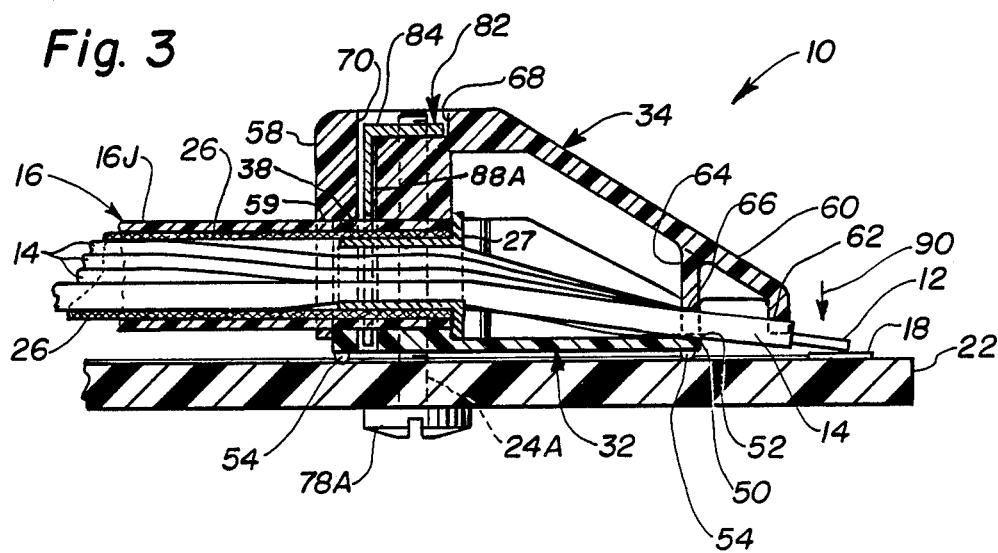
FIG. 3 is a side elevational view entirely in section of the assembled connector taken along section lines 3—3 in FIG. 2.

A plurality of fingers 60 extend forwardly from the main portion 56 of the cover 34. The fingers 60 are flexible and project, cantilever fashion, past the forward edge 50 of the base 32 when the cover 34 is secured thereto. The undersurface of each of the cantilevered fingers 60 is provided with grooves 62 which correspond in number and position to the grooves 52 formed in the base 32. Thus, when the cover 34 is secured to the base in a manner to be discussed the grooves 52, 62 respectively provided in each of the conjoined base 32 and the cover 34 cooperate to define guidance channels which accept the individual conductors 14 in spaced parallel adjacency across the width of the base 32. Spaced rearwardly from the fingers 60 and depending from the underside of the main portion 56 of the cover 34 is a partition 64. The lower edge of the partition 64 has grooves 66 (FIG. 3). The grooves 66 register axially with the channels defined by the registered grooves 52, 62 to clamp the conductors 14 and assist in supporting them within the recess 46 fo the base 32.

The main portion 56 of the cover 34 includes a cutout 68 thereon. A slot 70 and two bores 72A, 72B extend through the cover 34. The bores 72A, 72B are in registration with the bores 42A, 42B, respectively in the base 32 while the slot 70 is aligned with the slots 40 in the boss portion 36 of the base 32.

In operation, with the individual wires 12 of each conductor 14 exposed a predetermined distance from the ends the cable 16 is introduced through the access aperture defined by the cover 34 and the base 32. The conductors 14 are arranged in a fanned array with the conductors 14 being received in the grooves 52 near the forward edge 50 of the base 32. The conductors 14 are cantilevered past the edge 50.

The cover 34 is thereafter positioned over so that the skirts 57, 58 on the cover 34 closely overlie with the sidewalls 48 and the boss 36, respectively on the base 32 and such that the grooves 62 on the figners 60 receive the cantilevered conductors 14. The conductors 14 are received in the grooves 66 at the lower edge of the partition 64. Means 76, in the form of bolts 78A, 78B extend through the registered openings 24, 42 and 72 respectively provided in the substrate 22, the base 32 and the cover 34. The bolts 78 are threadedly secured to the base 32, the cover 34 and the substrate 22 to draw together these elements, thereby to flex the fingers 60.

In practice, a clip 82 having a plate portion 84 with threaded openings 86 and insulation displacement tines 88 thereon extends through the registered slots 70, 42 in the cover 34 and the base 32, respectively. The bolts 78 are threaded into the clip 82 as the substrate 20, the base 32, the cover 34 and the clip 82 are drawn together. As noted above, the forwardly projecting fingers 60 of the cover 34 are thus resiliently deformed. This deformation causes the fingers 60 to impose a biasing force in the direction of the arrow 90 on the extending portion of the conductors 14 which urges the exposed wires 12 thereof downwardly into contact with the pads 18. Moreover, as the clip 82 is drawn down by the action of the bolts 78 the tines 88 sever the jacket 16J of the cable 16 and electrically interconnect the ground shield 26 of the cable 16 with the clip 82. One of the bolts 78 may be connected to a ground tracing (not shown) on the substrate 22 to interconnect the shield 26 with that ground tracing.

The insulation displacement engagement of the times 88 of the clip 82 with the cable 16 also limits the axial rotation of the cable 16. The clamping action of the base 32 and the cover 34 on the cable 16 limits the vertical and lateral motion of the cable 16 and provides strain relief to the overall cable system.

Those skilled in the art, having the benefit of the teachings of the present invention as hereinabove set forth may affect numerous modifications thereto. These modifications are, however, to be construed as lying within the scope of the present invention as defined by the appended claims.

What is claimed is:

1. Apparatus for positioning the individual wires of a multiconductor cable with respect to a respective mounting pad provided on a substrate, the apparatus comprising:

a base mountable on the substrate, the base having a recess therein and forward edge thereon, the base having an array of positioning grooves adjacent to the forward edge thereof, the recess being sized to receive a fanned array of conductors and each groove being sized to receive one of the conductors and to support it in parallel relationship with an adjacent conductor such that the ends of the conductors extend cantilever fashion past the forward edge of the base, the wire of each extending conductor being in vertical registration with one of the pads:

a cover having an array of fingers thereon, the cover being connectible to the base with the undersurface of the fingers engaging the extending conductors; and means for drawing the substrate, base and cover together to flex the fingers and to impose a biasing force on the extending conductors thereby to urge the wires into contact with the pads.

2. The connector of claim 1 wherein the cover and the base cooperate to define an entrance aperture communicating with the recess through which the cable enters the recess, the entrance aperture being sized and configured to closely match the external configuration of the cable.

3. The connector of claim 2 wherein the cable has a ground conductor disposed therein, further comprising:

a ground contact element extendable through the cover and the base in the vicinity of the aperture therethrough, the contact element being engagable with the drawing means and responsive thereto to interconnect with the ground conductor in the cable as the cover, base and substrate are drawn together.

4. The connector of claim 1 wherein the cable has a ground conductor disposed thereon, further comprising:

a ground contact element engagable with the drawing means and responsive thereto to interconnect with the ground conductor in the cable as the cover, base and substrate are drawn together.

5. The connector of claim 4 wherein each of the fingers has a groove on the underside thereof, each groove being adapted to receive a portion of the conductor extending past the forward edge of the base, each of the grooves in the fingers registering axially with a groove in the base.

6. The connector of claim 3 wherein each of the fingers has a groove on the underside thereof, each groove being adapted to receive a portion of the conductor extending past the forward edge of the base, each of the grooves in the fingers registering axially with a groove in the base.

7. The connector of claim 2 wherein each of the fingers has a groove on the underside thereof, each groove being adapted to receive a portion of the conductor extending past the forward edge of the base, each of the grooves in the fingers registering axially with a groove in the base.

8. The connector of claim 1 wherein each of the fingers has a groove on the underside thereof, each groove being adapted to receive a portion of the conductor extending past the forward edge of the base, each of the grooves in the fingers registering axially with a groove in the base.

9. The connector of claim 8 wherein the cover further comprises a partition spaced behind the fingers, the partition having an array of grooves therein, the grooves in the partition axially registering with the grooves in the fingers, each groove in the partition receiving one of the conductors to assist in supporting the same in the base.

10. The connector of claim 7 wherein the cover further comprises a partition spaced behind the fingers, the partition having an array of grooves therein, the grooves in the partition axially registering with the grooves in the fingers, each groove in the partition receiving one of the conductors to assist in supporting the same in the base.

11. The connector of claim 6 wherein the cover further comprises a partition spaced behind the fingers, the partition having an array of grooves therein, the grooves in the partition axially registering with the grooves in the fingers, each groove in the partition receiving one of the conductors to assist in supporting the same in the base.

* * * * *